United States Patent [19]

Ainslie et al.

[11] 4,418,857
[45] Dec. 6, 1983

[54] HIGH MELTING POINT PROCESS FOR AU:SN:80:20 BRAZING ALLOY FOR CHIP CARRIERS

[75] Inventors: Norman G. Ainslie, Croton-on-Hudson, N.Y.; James E. Krzanowski, Watertown, Mass.; Paul H. Palmateer, Wappingers Falls, N.Y.

[73] Assignee: International Business Machines Corp., Armonk, N.Y.

[21] Appl. No.: 221,606

[22] Filed: Dec. 31, 1980

[51] Int. Cl.³ .............................................. B23K 31/02
[52] U.S. Cl. ............................. 228/124; 228/180 A; 228/198
[58] Field of Search .............. 228/122, 124, 186, 198, 228/180 A, 231, 232; 428/620

[56] References Cited

U.S. PATENT DOCUMENTS

| 3,242,391 | 3/1966 | Gorman | 317/234 |
| 3,340,602 | 2/1965 | Hontz | 228/232 |
| 3,364,064 | 1/1968 | Adrianus et al. | |
| 3,496,630 | 4/1966 | Duff | 228/231 |
| 3,648,357 | 3/1972 | Green | 228/186 |
| 3,935,986 | 2/1976 | Lattari et al. | 228/115 |

FOREIGN PATENT DOCUMENTS

| 1366349 | 6/1964 | France . | |
| 48-14505 | 5/1973 | Japan | 228/122 |
| 53-153573 | 5/1978 | Japan | 428/620 |
| 444012 | 2/1968 | Switzerland . | |

OTHER PUBLICATIONS

Hamilton et al., *Thermal Stress Resistant Solder Reflow Chip Joints*, vol. 14, No. 1, Jun. 1971, pp. 257–258.
Hitt and Wild, *Brazing Alloys for I/O Pins . . .*, IBM Disclosure Bulletin, 21, No. 9, 3590.
Ainslee et al., *Reducing Corrosion of Iron Silicone Alloy Magnetic Films*, IBM Disc. Bull., 22, No. 8A, 3384.
Slayton et al., *Brazing Process for . . . Alloys*, IBM Disclosure Bull., 21, No. 8, 3119.
Ainslee et al., *Au/Sn/Ag Braze Alloy*, IBM Tech. Disclosure Bulletin, 21, No. 8, 3117.
IBM Technical Disclosure Bulletin, N. Ainslie et al., "Au/Sn/Ag Braze Alloy", vol. 21, No. 8, Jan. 1979, p. 3118.

Primary Examiner—Nicholas P. Godici
Assistant Examiner—Marc Hodak
Attorney, Agent, or Firm—Graham S. Jones

[57] ABSTRACT

Brazing of elements to electronic chip carrying substrates requires brazing materials strong at high temperatures used to remove and replace chips. Flanges and pins are brazed with Au:Sn brazing alloys modified during brazing by addition of Group IB metal to the brazing material to promote formation of the higher melting point β phase of the alloy and a Group VIII metal to draw Sn out of the melt by gettering, also to promote formation of the β phase of the alloy and to thicken the braze material. An Au preform is plated with Ni and juxtaposed with surfaces to be brazed and the brazing materials to add Ni and Au to the melt almost simultaneously.

18 Claims, 12 Drawing Figures

HIGH MELTING POINT PROCESS FOR AU:SN:80:20 BRAZING ALLOY FOR CHIP CARRIERS

BACKGROUND OF THE INVENTION

1. Field of the Invention

This invention relates to bonding of input/output electrical connection pins and other components to a chip carrying substrate in an electronic system. More particularly, this invention relates to electronic circuit interconnection bonding techniques for fabrication of a chip carrying substrate and its pins in a manner compatible with the continuous reheating of the chips.

An object of this invention is to be able to attach or replace a chip on the substrate without disturbing the bond between pins connected to the substrate or the surfaces to which the substrate itself is bonded. In other words, the object is to bond pins, etc., to the substrate and the substrate to its carrier with a bonding material having a melting point such that the structure is unaffected by melting of the solder connections retaining the chips upon the substrate.

Brazing of elements to electronic chip carrying substrates such as multilayered ceramic substrates requires providing a brazing or soldering material which remains strong at high temperatures used for rework, i.e., removal and replacement of chips on the substrate, with the heat being required for heating the lead-tin solder balls supporting the chips. A standard solution to this problem is to use gold-tin solder whose melting point subsequent to brazing is higher than the initial 280° C. melting point.

Here because circuit connection pins have tended to tilt out of alignment during rework heating, and because problems have arisen in flange sealing with numerous cycles of rework, the braze alloy is modified during brazing by adding a Group IB metal, i.e., gold, copper and/or silver to the brazing material (which raises the melting temperature subsequent to bonding by increasing the amount of the higher melting point β phase of the alloy in the braze material) and a metal such as nickel, palladium or another Group VIII metal (which will tend to draw tin out of the melt or to getter the tin thereby promoting the apparent ratio of gold or IB metals to tin and the formation of the β phase of the Au-Sn alloy thereby tending to raise the melting temperature of the brazed joint subsequent to cooling, even further as well as thickening the braze material). In one aspect of the method, a gold preform is plated with nickel and placed in juxtaposition with the surface to be brazed along with the brazing material in order to add nickel and gold to the melt of the brazing material almost simultaneously.

2. Background Art

U.S. Pat. No. 3,648,357 of Green, "Method for Sealing Microelectronic Device Packages" is concerned with hermetically sealing of a Kovar and glass housing and a Kovar alloy (Ni, Fe, Co) cover together with an eutectic gold-tin solder. In the past Green stated that (Col. 1, lines 12 et seq.) such packages had been sealed by placing ". . . a solder preform between the periphery of the edges of the housing and the cover to be sealed together." Then the parts to be soldered together were "placed in a sealing machine and . . . heated to a sufficient temperature to cause the solder to fuse onto the cover and housing. Unfortunately, imperfect hermetic seals result in a substantial portion of the packages so sealed. Not only may leaks in the seal result due to voids therein, but the temperature necessary to melt the solder and form the seal may be sufficient to damage the microelectronic device contained in the package . . . ".

In Green, the approach was to coat an 80:20 Au:Sn preform upon both the housing flange and upon the mating surface of the cover which fits upon the housing. In that way, the preform solder halves can be joined together at a low temperature at which the solder melts requiring little heat so as to reduce damage to the microelectronic device. However, since the Kovar alloy reacts badly with Au:Sn solder, the surfaces of Kovar alloy are first coated with gold by plating. Then the preforms are soldered to the plated housing and cover. The pretinning had the disadvantage that it raised the temperature of melting of the solder to the degree that the gold is melted from the Kovar plated surfaces. The purpose of the Green patent was to keep the melting point down to about 330° C. rather than the 400° C. temperature which would result with melting of the gold into the solder under equilibrium conditions. Use of the lower temperature assures that at equilibrium only a portion of the plated gold "will be dissolved into the solder."

A current practice in the industry is to join pins composed of Kovar alloy with a thin film of palladium with nickel pads deposited upon a thin film of molybdenum. The solder used is an Au:Sn brazing alloy. The Pd layer melts away after about four of the ten solder reflows one would expect under current practices in microelectronic circuit manufacture. As a result, a problem of leaching of Ni from the Kovar alloy pins and the pad below into the braze which is unacceptable since it results in poor adhesion, causing rejection of the entire device. Accordingly, it is the desideratum to be able to reheat the braze repeatedly during such reflows with freedom from the remelting of the braze and consequent introduction of impurities into the braze which would ruin the product because of such weakening of the interface with the Kovar alloy.

Hitt et al, "Brazing Alloys for I/O Pins to Multilayer Ceramic Electronic Modules", IBM Technical Disclosure Bulletin, Vol. 21, No. 9, 3950 (Feb. 1979) describes braze alloys of weight percentages of as follows: 75 Au, 16.2 Sn, and 8.8 Pd; and 80 Au, 15 Sn, and 5 Pd used for brazing I/O pins and frames for ceramic modules. No additional metal is supplied for the purpose of altering the melting point of the liquid alloy in the braze subsequent to its liquefaction.

Ainslie et al, "Au/Sn/Ag Braze Alloy", IBM Technical Disclosure Bulletin, Vol. 21, No. 8, 3118 (Jan. 1979) describes a braze alloy for electronic packaging for Be-Cu contact pins or Kovar (Ni, Co, Fe) pins brazed with 67 Au/15 Sn/18 Ag. In either case there is either a Group IB of the Period Table of the Elements metal (Cu) or a Group VIII metal (Ni, Fe, Co) in the Be-Cu or Kovar pins which fails to have the effect provided in accordance with the present invention. In addition, the alloy of the ratio of 67 Au to 15 Sn is not the 80/20 ratio with the eutectic point permitting low temperature melting of the alloy, in the phase diagram at about 280° C. which is enhanced by the added Group IB metal raising the liquidus temperature while the Group VIII metal removes Sn from the alloy. Here lowering the Sn in the alloy tends to move the alloy towards a lower melting point of the alloy from a high of about 400° C. at 67% Au down near 280° C. as the copper and nickel operate to move the alloy down to the eutectic point. Thus, the temperature effect is the opposite of what is desired here. The 18% of Ag in the alloy, however, acts as a substitute for gold since it is a Group IB metal which raises the melting point of the resulting alloy.

Another article of Ainslie et al, "Au/Sn/Ag Braze Alloy", IBM Technical Disclosure Bulletin Vol. 21, No. 8, 3117 (Jan. 1979) describes a braze alloy of 70 Au/25 Sn/5 Ag for pin or electronic component brazing. The alloy can withstand chip joining cycles of reheating at 350° C. The liquidus is at 358° C. The total of Group IB metals is 75 weight percent as compared with the 25 weight percent of Sn. The pins brazed are Be-Cu pins. This alloy has the disadvantage of not having the original low melting point of an 80:20 Au:Sn brazing alloy.

Slayton et al, "Brazing Process for 57.2 Au/30.8 Sn/12.0 Ag Alloys", IBM Technical Disclosure Bulletin Vol. 21, No. 8, 3119 (Jan. 1979) describes a brazing alloy for electronic packaging components for pin brazing. It is indicated that there is Ni which if unreacted remains upon the substrate. It also states that too early a "slow-down in cooling rate results in excessive Ni consumption and poor mechanical properties."

In accordance with this invention, joining of objects together is performed by brazing of eutectic Au:Sn solder at a low temperature, and in the process elevating the melting point substantially above the eutectic point subsequently to avoid pin tilt of brazed pins, braze strength degradation and other relative motion between the parts being brazed together during reflow operations upon the micro-electronic circuit.

The process of this invention involves brazing a first surface to a second surface by means of a gold-tin brazing solder, characterized by providing a source of a Group IB metal and a source of a Group VIII metal in combination with the brazing solder, to come into contact with the first and second surfaces during brazing, whereby the melting temperature of the brazing solder is raised substantially during brazing to a temperature substantially above the initial melting temperature of the solder which is reflowed repeatedly whereby the solder joint formed by the braze is unafffected by reflow cycles. This is accomplished by increasing the amount of $\beta$ phase ($\simeq$Au-10 wt. % Sn) in the braze, which greatly increases the melting point as the percentage of Au-Sn alloy in the braze is decreased.

DESCRIPTION OF THE PREFERRED EMBODIMENT

The problems solved by this invention relate to the brazing of pins to a chip carrying substrate or the brazing of the substrate to a flange used to support the substrate carrying chips and to provide for clamping in a hermetically-sealed chip packaging arrangement.

Figure 1:
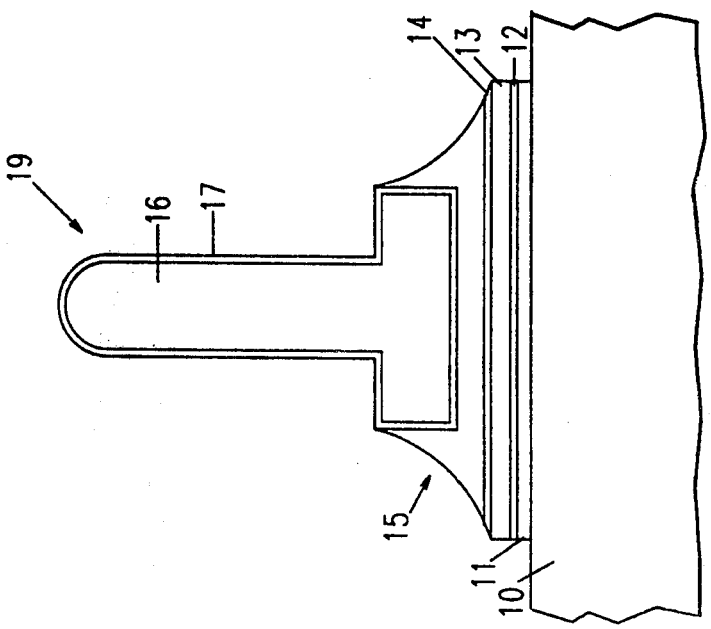
FIG. 1 shows a fragment of a multilayered ceramic substrate carrying a connector pin.

FIG. 1 shows a multilayered ceramic substrate 10 carrying a molybdenum pad 11, which is conventionally protected with a layer of nickel 12 about 3-4 micrometers thick. Next is a layer 13 of a relatively thick film of a Group IB metal (Cu, Ag or Au) about 0.0002-0.0025 cm thick. The layer 13 is coated with a very thin layer 14 up to 1.25 $\mu$m thick of a Group VIII metal such as Fe, Co, Ni, Ru, Rh, Pd, Os, Ir or Pt to serve as a source of an Sn gettering metal. In this example the gettering metal layer 14 is nickel. Next, a braze fillet 15 of Au 80:Sn 20 brazing composition is set on top of the layers mentioned above. Here the fillet is a narrow strip of metal. Above the fillet 15 is a conventional pin 19 (or a Cu base pin) of Kovar alloy 16 coated with a thin film 17 of nickel. When the Au-Sn 20 fillet 15 is heated to above 280° C. which is its liquidus point for the eutectic 80:20 alloy, it melts and when the temperature rises to about 390° to 405° C. (nominally 395° C.) the Group IB layer 13 is at least partially melted into the Au:Sn braze melt along with some of the Group VIII metal 14, e.g., nickel. The gold in the alloy tends to form higher temperature liquidus alloys with a higher melting point upon cooling of the melt. The nickel in the melt tends to getter or collect the tin drawing it out of reaction with the Au-Sn alloys in the melt, thereby reducing the amount of tin available for combination in the Au-Sn alloy. The effect is to provide an effectively greater percentage of Au in Au-Sn alloy thereby tending to promote formation of the Au-rich $\beta$ phase. The resulting braze joint is very strong and its melting point is far higher so subsequent reflows of Pb:95-Sn:5 solder balls at 350° C. to 360° C. tend not to cause melting of the braze joint as occurred heretofore.

Figure 2:
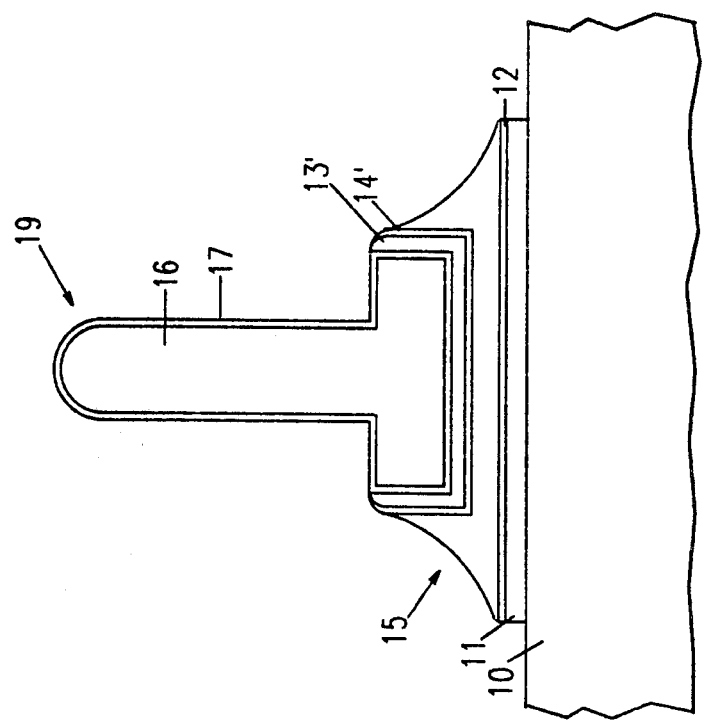
FIGS. 2-8 are modifications of FIG. 2 with different locations of Group IB and Group VIII metals or different pin materials.

In FIG. 2, the layer 13' of a Group IB metal such as gold and the layer 14' of the gettering metal such as nickel from Group VIII has been coated onto the pin 19 to be joined by the preform to the substrate 10. Otherwise, the embodiment is the same as FIG. 1. The point is that the gold and nickel, for example, can be located on the top of the Mo, Ni pad or can be placed upon the surface of the pin 19. In either case as the braze material melts, the gold and nickel are introduced into the braze melt.

Figure 3:
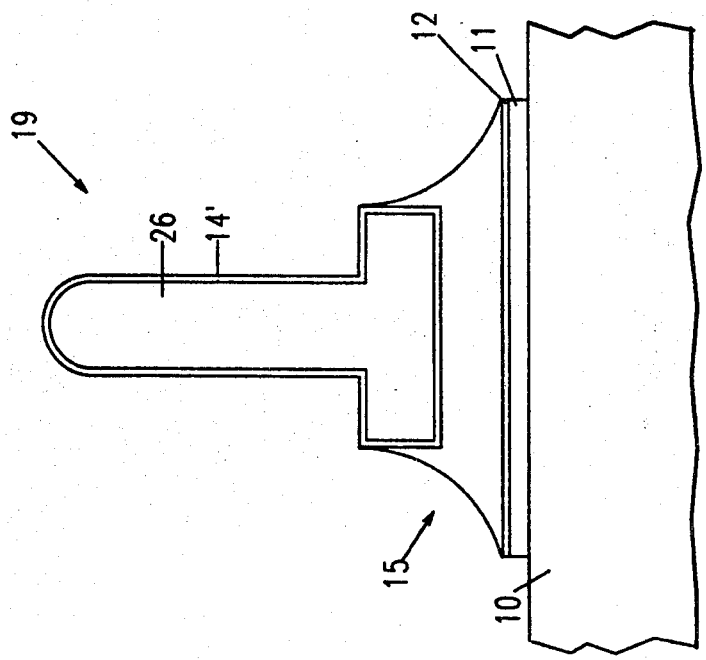

In FIG. 3, the pin 19 has been replaced by a Cu pin 26 coated with a thin layer of nickel 14' or other Group VIII metal. The Cu pin serves as a source of an IB metal in order to add to the Au in the Au-Sn melt. Thus, as in FIG. 2, the source of the two additives to the braze during its melting phase is the metal on the stud of the pin 26.

Figure 4:
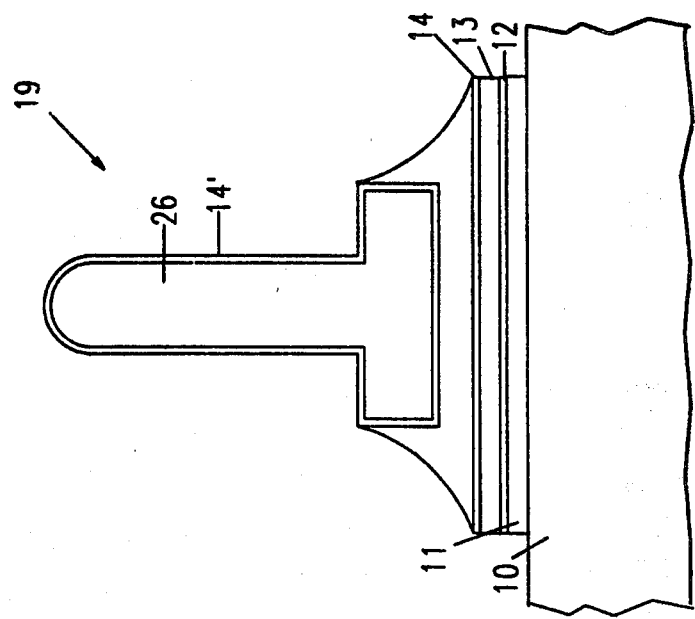

In FIG. 4, the pin is the same as in FIG. 3 but at the base of the fillet, the nickel and gold layers 14 and 13 from FIG. 1 have been added so that the additional Group 1B and Group VIII metals are available to the fillet from above and below during its molten phase.

Figure 5:
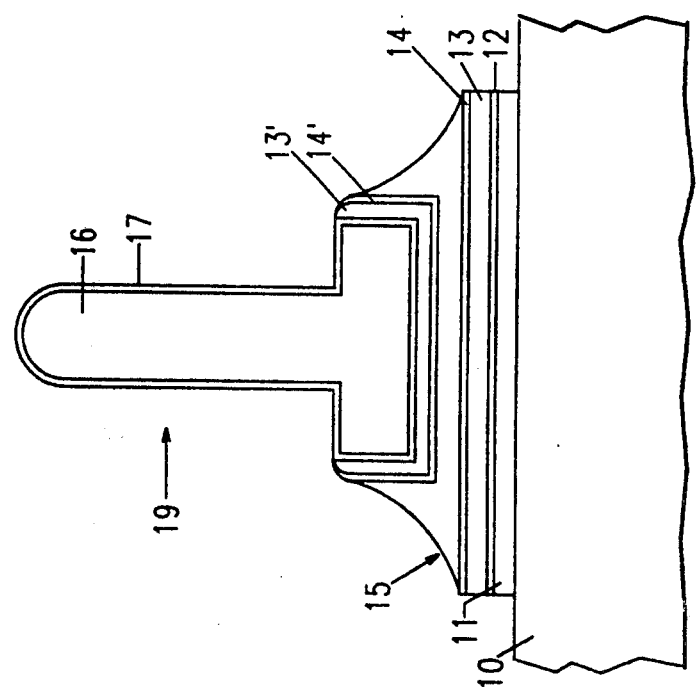

In FIG. 5, the Kovar (or Cu base) pin 19 with coating of FIGS. 1 and 2 is used with the layers of gold and nickel 13' and 14', and the layers of gold 13 and nickel 14 are added at the base of the fillet on pad 11 coated with layer 12 as in FIG. 1. Again, an ample supply of the precious Group IB metals (Au, Cu, or Ag) 13, 13' and the gettering Group VIII metals Ni, Pd, etc., 14, 14' are available to the molten braze alloy 15.

Figure 6:
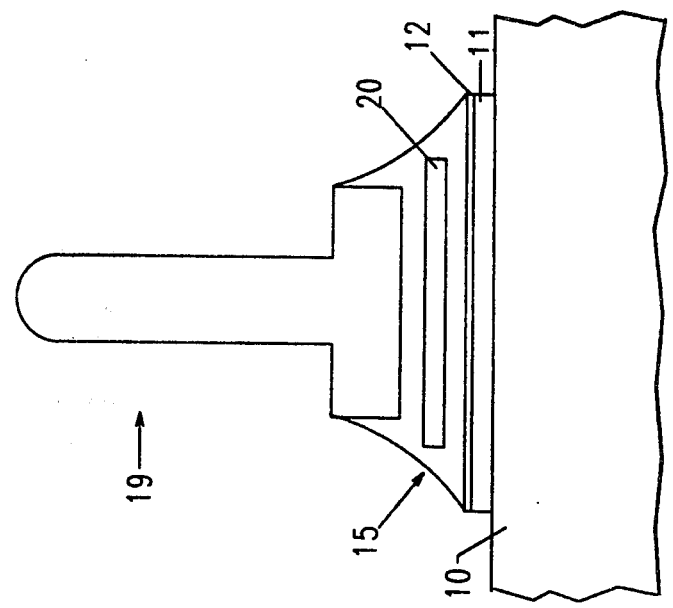

In FIG. 6, the pin 19 which may be of the type in FIG. 1 or FIG. 3 sits upon a typical braze fillet 15 which has been modified to include within it a precious metal Group IB gettering metal Group VIII preform 20 which comprises, for example, an Au-Ni alloy such as Au:82-Ni:18. The extra layers of nickel and gold or the equivalent both upon the pin 19 and upon the layer 12 on pad 11 can be omitted, although they need not be eliminated.

Figure 7:
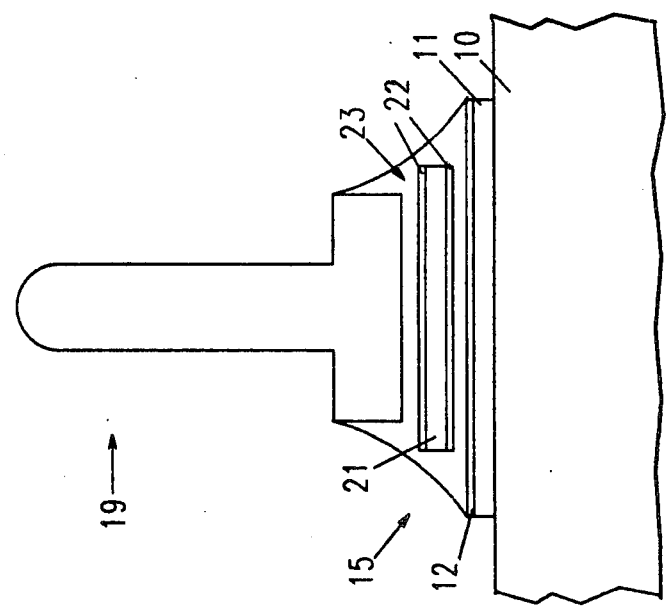

In FIG. 7, the embodiment is essentially the same as that in FIG. 6 except that the preform 20 has been replaced by a preform 23, of noble metal 21 coated with gettering metal 22. The gettering metal in this case is very thin, as is the layer 14 in FIG. 1.

Figure 8:
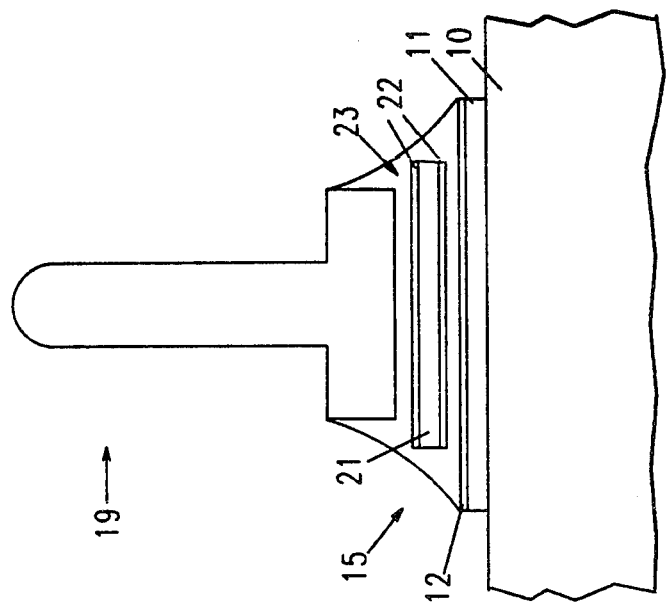

In FIG. 8, the embodiment is basically the same as in FIG. 7 with the exception that a Cu or Ag layer 21 in preform 23 is plated with Ni or the equivalent gettering metal 22.

The reasons for the resistance to melting are as follows:

1. The initial reflow of the solder balls of chips carried on the substrate (after the brazing) causes the solid state reaction of the excess Au with the Au-Sn alloy to form the β phase alloy with the latter having a higher melting temperature. Continued reflows cause further reaction within the alloy to form the β phase and thereby strengthen the joint instead of degrading the joint as would happen with simple Au-Sn braze fillets 15.

2. It has been noted that in the flange brazing, much less brittle Ni-Sn intermetallic compound is formed at the interfacial surfaces. In addition, this process prevents the pin climb of metal up the shank of a pin 16. Stiffening of the braze is provided by adding the Group VIII metal such as Pd or Ni in small quantities which forms a dispersed precipitate of the metal with Sn which stiffens the alloy especially at reflow temperatures. It also raises the melting temperature by increasing the amount of β phase Au-Sn alloy to a significant degree.

Figure 9:
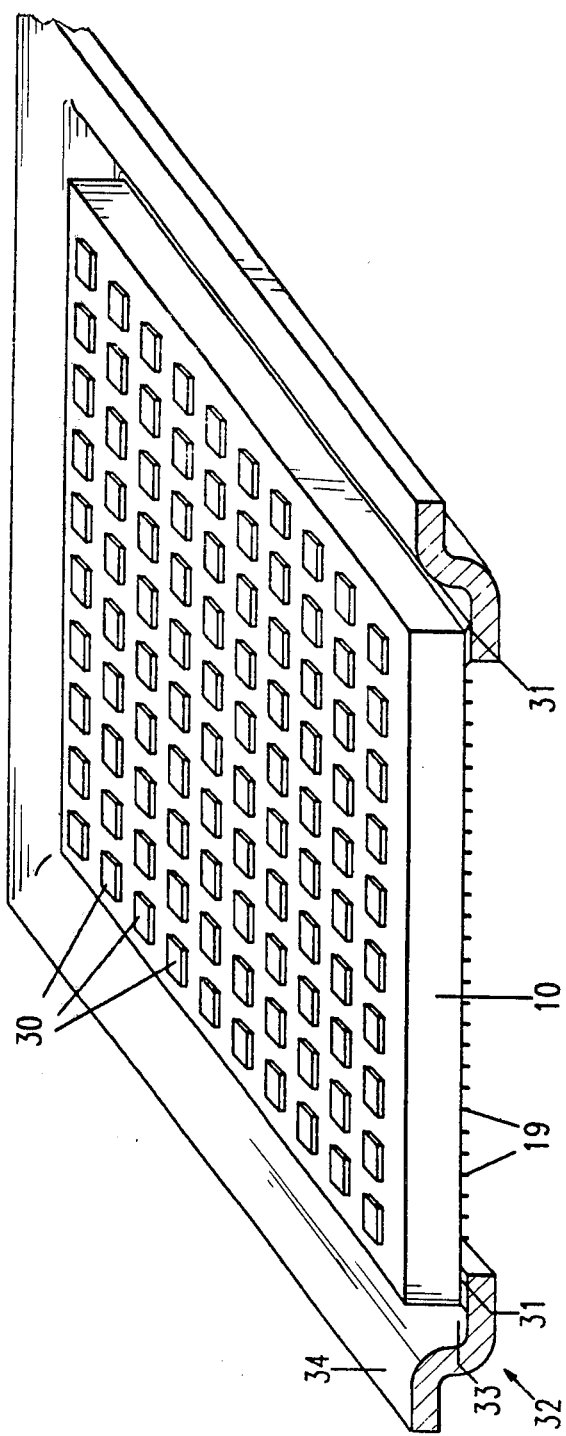
FIG. 9 shows a perspective, partially sectional view of the upper surface of a substrate of FIGS. 1-8 carrying a large number of semiconductor chips. The substrate is mounted upon a flange. On the lower surface of the substrate are the pins shown in FIGS. 1-8.

FIG. 9 shows a square substrate 10 carrying 100 chips 30 with the substrate 10 brazed to a square mounting flange 32 with a lower flange surface 33 carrying the substrate by braze metal 31 on the periphery of the substrate 10. Beneath the substrate 10 are the pins 19.

Figure 10:
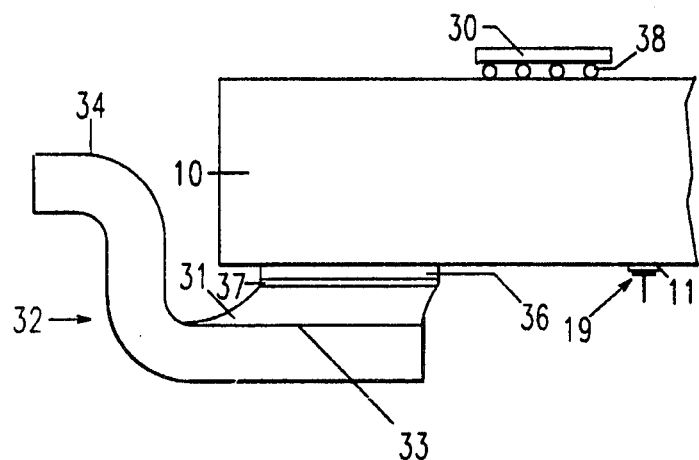
FIG. 10 an enlarged, front elevational view of the section shown in FIG. 9. The braze joints of the flange and the pins to the substrate are shown.

FIG. 10 shows the substrate 10 with Mo border 36 coated with nickel layer 37. Layer 37 is brazed to the flange surface 33 by the braze metal 31. A set of pins 19 brazed to the base of the substrate 10. A chip 30 is connected to substrate 10 by solder ball connections 38.

Figure 11:
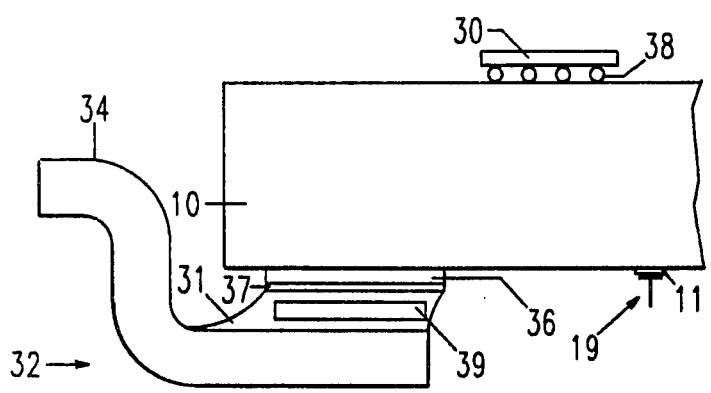
FIG. 11 shows a modification of FIG. 10.

FIG. 11 shows a preform 39 within the braze fillet 31. Preform 39 is composed of a gold-nickel alloy or the equivalent. The braze 31 comprises the usual Au-20 Sn brazing material.

Figure 12:
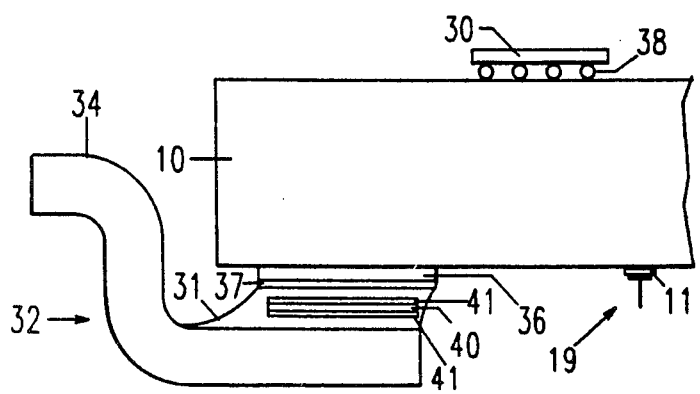
FIG. 12 shows another modification of FIG. 10.

FIG. 12 shows a modification of the preform of FIG. 11 with the preform composed of a gold or equivalent slab 40 plated with a pair of layers of a thin film 41 of nickel or the equivalent (Group VIII metal) of up to about 0.0006 mm.

Having thus described our invention, what we claim as new and desire to secure by Letters Patent is:

1. In a process of brazing metallic elements to a substrate in a thin film electronic circuit package wherein said substrate carries said metallic elements and solder connections supporting a plurality of chips on said substrate, with the metallic elements brazed to said substrate by means of a gold tin brazing solder, the improvement comprising providing a source of a Group IB metal and a thin film source of a Group VIII metal within a thickness of up to about 1.25 μm thick coating said Group IB metal, said Group VIII metal being adjacent to said gold tin solder, said Group IB metal, said Group VIII metal in combination with said brazing solder coming into contact with said metallic elements during brazing, whereby the melting temperature of said brazing solder is raised substantially during brazing to a value above the melting temperature of said solder connections.

2. The process of claim 1 wherein said source of a Group IB metal and a Group VIII metal is coated on the surface of said substrate to be brazed prior to the brazing operation.

3. The process of claim 1 wherein a said source of a Group IB metal and a Group VIII metal is coated on the surface of said metallic elements to be brazed prior to the brazing operation.

4. The process of claim 1 wherein a source of a Group IB metal and a Group VIII metal is derived from the composition of said metallic elements during brazing.

5. The process of claim 2 wherein a said source of a layer of a Group IB metal and then a thin film of up to about 1.25 μm thick of a Group VIII metal is coated on the surface of said metallic elements to be brazed prior to the brazing operation.

6. The process of claim 2 wherein a source of a Group IB metal and a Group VIII metal is derived from the composition of said metallic elements during brazing, wherein said Group VIII metal comprises a thin film of up to about 1.25 μm thick applied to the exterior of said Group IB metal.

7. A process in accordance with claim 1, wherein said substrate is mounted to a flange with the flange and the substrate being brazed together by said brazing solder with the substrate brazing area being coated with an Mo border coated with a nickel layer.

8. A process in accordance with claim 7 wherein said flange includes braze metal, and said braze metal on said flange contains a preform of gold-nickel alloy and said braze metal comprises Au-20Sn.

9. A process in accordance with claim 8 wherein said preform comprises a gold layer plated with a thin film of nickel.

10. A process in accordance with claim 9 wherein said layer of nickel has a thickness of up to 0.0006 mm.

11. In a process of brazing metallic elements to a substrate in a thin film electronic circuit package wherein said substrate carries said metallic elements and solder connections supporting a plurality of chips on said substrate, with the metallic elements brazed to said substrate by means of a gold tin brazing solder, the improvement comprising providing a source of a Group IB metal and a source of a Group VIII metal in combination with said brazing solder, to come into contact with said metallic elements during brazing, whereby the melting temperature of said brazing solder is raised substantially during brazing to a value above the melting temperature of said solder connections said substrate is mounted to a flange with the flange and the substrate being brazed together by said brazing solder with the substrate brazing area being coated with an Mo border coated with a nickel layer, said source of a Group IB metal and a Group VIII metal being a flat preform located within a braze fillet between said substrate and a said metallic element prior to brazing.

12. The process of claim 11 wherein said preform is an alloy of said Group IB and Group VIII metals.

13. The process of claim 11 wherein said preform comprises a slab of a Group IB metal coated with a Group VIII metal.

14. In a process of brazing metallic pins to a substrate in a thin film electronic circuit package wherein said substrate carries said metallic pins and solder connections supporting a plurality of chips on said substrate, with said metallic pins brazed to said substrate by means of a gold tin brazing solder, the improvement comprising providing a source of Group IB metal and a source of a Group VIII metal in combination with said brazing solder, to come into contact with said metallic pins during brazing, whereby the melting temperature of said brazing solder is raised substantially during brazing to a value above the melting temperature of said solder connections, wherein a source of a Group IB metal and Group VIII metal is derived from the composition of said metallic pins during brazing wherein a said metallic pin is composed of a core of a Group IB metal coated with a Group VIII metal prior to brazing.

15. The process of claim 14 wherein said source of a Group IB metal and a Group VIII metal is coated on the surface of said substrate to be brazed prior to the brazing operation.

16. In a process of brazing metallic pins to a substrate in thin film electronic circuit package wherein said substrate carries said metallic pins and solder connections supporting a plurality of chips on said substrate, with the metallic elements brazed to said substrate by means of gold tin brazing solder, the improvement comprising providing a source of a Group IB metal and a source of a Group VIII metal in combination with said brazing solder, to come into contact with said metallic pins during brazing, whereby the melting temperature of said brazing solder is raised substantially during brazing to a value above the melting temperature of said solder connections wherein said source of a Group IB metal and a Group VIII metal is a flat preform located within a braze fillet between said substrate and a said metallic element prior to brazing.

17. The process of claim 16 wherein said preform is an alloy of said Group IB and Group VIII metals.

18. The process of claim 16 wherein said preform comprises a slab of a Group IB metal coated with a Group VIII metal.

* * * * *